United States Patent
Taeger et al.

(10) Patent No.: US 10,193,303 B2
(45) Date of Patent: Jan. 29, 2019

(54) SEMICONDUCTOR LASER DIODE, METHOD FOR PRODUCING A SEMICONDUCTOR LASER DIODE AND SEMICONDUCTOR LASER DIODE ARRANGEMENT

(71) Applicant: OSRAM Opto Semiconductors GmbH, Regensburg (DE)

(72) Inventors: Sebastian Taeger, Bad Abbach (DE); Alexander Bachmann, Ismaning (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/105,554

(22) PCT Filed: Dec. 8, 2014

(86) PCT No.: PCT/EP2014/076902
§ 371 (c)(1),
(2) Date: Jun. 16, 2016

(87) PCT Pub. No.: WO2015/091060
PCT Pub. Date: Jun. 25, 2015

(65) Prior Publication Data
US 2016/0315446 A1    Oct. 27, 2016

(30) Foreign Application Priority Data

Dec. 17, 2013   (DE) .................. 10 2013 114 226

(51) Int. Cl.
*H01S 5/024*    (2006.01)
*H01S 5/022*    (2006.01)
(Continued)

(52) U.S. Cl.
CPC ........ *H01S 5/02461* (2013.01); *H01S 5/0224* (2013.01); *H01S 5/02272* (2013.01);
(Continued)

(58) Field of Classification Search
CPC .... H01S 5/2036; H01S 5/0224; H01S 5/2461; H01S 5/02461
See application file for complete search history.

(56) References Cited

U.S. PATENT DOCUMENTS 5,623,509 A * 4/1997 Iwano .................... B82Y 20/00
                                                         372/24
6,636,539 B2 * 10/2003 Martinsen ........... H01S 5/02461
                                                         372/36
(Continued)

FOREIGN PATENT DOCUMENTS

DE        10222499 A1    12/2003
DE     102011055891 A1     6/2013
(Continued)

OTHER PUBLICATIONS

Evans, T. et al., "Proceedings of ISAF 2000: Aerogel Isolated Pyroelectric IR Detector", ISAF 2000, Proceedings of the 2000 12th IEEE, International Symposium on Applications of Ferroelectrics, Jul. 21-Aug. 2, 2000, vol. II, 18 pgs.

(Continued)

*Primary Examiner* — Michael Carter
(74) *Attorney, Agent, or Firm* — McDermott Will & Emery LLP (57) ABSTRACT

A semiconductor laser diode is specified, comprising a semiconductor layer sequence (1) with semiconductor layers applied vertically one above another with an active layer (11), which emits laser radiation via a radiation coupling-out surface during operation, wherein the radiation coupling-out surface is formed by a side surface of the semiconductor (Continued)

layer sequence (1), and a heat barrier layer (2) and a metallic contact layer (5) laterally adjacent to one another on a main surface (12) of the semiconductor layer sequence (1), wherein the heat barrier layer (2) is formed by an electrically insulating porous material (9). As a result, the heat arising during operation is conducted via the p-type electrode (5) to a heat sink (20) and the formation of a two-dimensional temperature gradient is avoided. A thermal lens in the edge emitter is thus counteracted. Furthermore, a method for producing a semiconductor laser diode and a semiconductor laser diode arrangement are specified.

23 Claims, 6 Drawing Sheets (51) Int. Cl.
*H01S 5/042* (2006.01)
*H01S 5/20* (2006.01)
*H01S 5/22* (2006.01)

(52) U.S. Cl.
CPC ........ *H01S 5/02469* (2013.01); *H01S 5/0425* (2013.01); *H01S 5/209* (2013.01); *H01S 5/22* (2013.01); *H01S 5/2036* (2013.01); *H01S 2301/176* (2013.01)

(56) References Cited

U.S. PATENT DOCUMENTS

| | | |
|---|---|---|
| 2002/0042210 A1 | 4/2002 | Mandal et al. |
| 2002/0176459 A1 | 11/2002 | Martinsen |
| 2003/0044132 A1 | 3/2003 | Nasu et al. |
| 2005/0098786 A1* | 5/2005 | Sai .......... H01S 5/0425 257/79 |
| 2009/0213591 A1 | 8/2009 | Katabe et al. |
| 2010/0155325 A1* | 6/2010 | Zhang ........ B01D 39/1692 210/500.21 |
| 2011/0164642 A1 | 7/2011 | Onishi et al. |
| 2012/0148804 A1* | 6/2012 | Dodi ............ B32B 5/18 428/188 |
| 2014/0011014 A1* | 1/2014 | King ............ C25D 5/02 428/312.2 |
| 2015/0201463 A1* | 7/2015 | Madani ........ H05B 3/10 204/192.15 |

FOREIGN PATENT DOCUMENTS

| | | |
|---|---|---|
| JP | H09260539 A | 10/1997 |
| JP | H10051065 A | 2/1998 |
| JP | 2003069131 A | 3/2003 |
| JP | 2007220830 A | 8/2007 |
| JP | 2010123642 A | 6/2010 |
| JP | 2011508440 A | 3/2011 |
| JP | 2011134870 A | 7/2011 |
| WO | WO-2006104061 A1 | 10/2006 |
| WO | 2013079346 A1 | 6/2013 |

OTHER PUBLICATIONS

Elias, J. et al., "Hollow Urchin-Like ZnO Thin Films by Electro-chemical Deposition", Advanced Materials, 2010, 22, pp. 1607-1612.

Hyun, S. et al., "Synthesis and Characterization of Low-Dielectric Silica Aerogel Films", J. Am. Ceram. Soc., 83(3), 2000, pp. 533-540.

Sun, W. et al., "Higher Brightness Laser Diodes with Smaller Slow Axis Divergence", Proc. SPIE 8605, High-Power Diode Laser Technology and Applications XI, 86050D, Feb. 26, 2013, 12 pgs.

* cited by examiner

SEMICONDUCTOR LASER DIODE, METHOD FOR PRODUCING A SEMICONDUCTOR LASER DIODE AND SEMICONDUCTOR LASER DIODE ARRANGEMENT

This patent application claims the priority of German patent application 10 2013 114 226.5, the disclosure content of which is herewith incorporated by reference.

A semiconductor laser diode, a method for producing a semiconductor laser diode and a semiconductor laser diode arrangement with a semiconductor laser diode are specified.

In addition to a high optical output power and a high electro-optical efficiency, laser diodes such as e.g. high-power laser diodes for a fiber coupling also require narrow emission angles, so as to be able to couple as much luminous power as possible into a glass fiber. This is expressed by way of the physical quantity denoted by brilliance. While the emission in the plane perpendicular to the layer structure of the laser diode, denoted "fast axis", can be focused sufficiently well in conventional high-power laser diodes as a result of the small emitting region, the emission in the layer plane, denoted "slow axis", generally is the limiting factor, particularly in the case of wide-stripe laser diodes, if an attempt is made to increase the brilliance and thereby realize fiber laser systems or fiber-coupled lasers for a direct application in a more cost-effective manner.

A cause for increasing slow-axis divergences in the case of high optical output powers is the formation of a temperature distribution, referred to as a thermal lensing, laterally in the resonator. This happens because conventional laser diodes are designed in such a way for realizing optimal heat dissipation that they have large-area metallization on the side on which they are soldered onto a heatsink. Hence, the heat is not only dissipated perpendicular to the epitaxial layers but also in a two-dimensional manner due to the finite thermal resistance of the metallization layers, the solder and the heatsink. As a result, a temperature profile is formed in the active region of the laser due to power dissipation, which temperature profile, in lateral section, has a maximum in the center of the resonator and drops off toward the outside. An optical lens, which focuses the circulating light in the resonator and, as a consequence, increases the emission divergence of the laser, is formed as a result of the temperature dependence of the optical refractive index and the optical gain.

It is at least one object of specific embodiments to specify a semiconductor laser diode in which an inhomogeneity in the temperature distribution is reduced in comparison with known laser diodes. Furthermore, objects of specific embodiments are to specify a method for producing a semiconductor laser diode and a semiconductor laser diode arrangement with a semiconductor laser diode.

These objects are achieved by the subjects and a method in accordance with the independent patent claims. Advantageous embodiments and developments of the subjects and of the method are characterized in the dependent claims and furthermore emerge from the subsequent descriptions and the drawings.

In accordance with at least one embodiment, a semiconductor laser diode has a semiconductor layer sequence with semiconductor layers applied vertically over one another. In particular, the semiconductor layer sequence has an active layer configured to emit laser radiation by way of a radiation output surface during operation. To this end, the active layer can have, in particular, an active region for emitting the laser radiation. The radiation output surface is formed by a side face of the semiconductor layer sequence which forms a resonator in the longitudinal direction with an opposite rear side face of the semiconductor layer sequence. The semiconductor laser diode described here is preferably a so-called edge-emitting semiconductor laser diode. The semiconductor layers each have a main plane of extent directed perpendicular to the vertical growth direction. Directions perpendicular to the vertical growth direction are denoted here and below as the lateral directions. In particular, a lateral direction along the emission direction can also be referred to as longitudinal direction while a lateral direction perpendicular to the emission direction can be referred to as transverse direction.

In accordance with a further embodiment, the semiconductor layer sequence comprises further functional semiconductor layers, for example waveguide layers, cladding layers, buffer layers and/or semiconductor contact layers in addition to the active layer. By way of example, as an active layer, the semiconductor layer sequence can have a conventional pn junction, a double heterostructure or a single or multiple quantum well structure. By way of example, the quantum well structure can comprise quantum wells, quantum wires or quantum dots, or combinations of these structures. By way of example, the semiconductor layer sequence can have one or more semiconductor layers made of an arsenide, phosphide or nitride semiconductor material. A semiconductor layer sequence on the basis of e.g. $In_xGa_yAl_{1-x-y}As$ is suitable for long wavelength, infrared to red radiation, a semiconductor layer sequence on the basis of e.g. $In_xGa_yAl_{1-x-y}P$ is suitable for red radiation and a semiconductor layer sequence on the basis of e.g. $In_xGa_yAl_{1-x-y}N$ is suitable for short wavelength visible radiation, i.e., in particular, in the region of green to blue light, and/or for UV radiation, where $0 \leq x \leq 1$ and $0 \leq y \leq 1$ in each case. The semiconductor layers of the semiconductor layer sequence are preferably grown on a substrate. After growth, the substrate can be wholly or partly removed. Furthermore, a further contact layer can be present on a main surface of the substrate facing away from the semiconductor layer sequence.

In accordance with a further embodiment, the semiconductor layer sequence is delimited in the vertical direction on one side by a main surface, which substantially extends in the lateral direction. This can mean that the main surface has a planar embodiment with a main plane of extent that is perpendicular to the growth direction. Furthermore, the main surface can also have surface structures, by means of which the main surface can have a form deviating from a planar face. By way of example, the main surface can have one or more web structures. By way of example, a substrate on which the semiconductor layer sequence is applied can be arranged on the side of the semiconductor layer sequence lying opposite the main surface.

By way of example, the semiconductor layer sequence can be formed by a semiconductor wafer from which a multiplicity of semiconductor laser diodes can be separated by subsequent singulation. Each one of the semiconductor laser diodes can have one or more active regions and therefore can be embodied as a single emitter or multiple emitter, which can also be denoted as a laser bar. Furthermore, the semiconductor layer sequence can already be a singulated part of a semiconductor wafer, which corresponds to the subsequently completed semiconductor laser diode.

In accordance with a further embodiment, a thermal barrier layer and a metallic contact layer are applied laterally adjacent to one another on the main surface of the semiconductor layer sequence. In particular, this means that the thermal barrier layer and the metallic contact layer are arranged over the active layer in a vertical direction and next to one another on the semiconductor layer sequence in a lateral direction.

In accordance with a further embodiment, the thermal barrier layer is formed by an electrically insulating porous material. Thus, the thermal barrier layer has an electrically insulating material, in which a multiplicity of pores, i.e. cavities, are formed.

In accordance with at least one further embodiment, a method for producing a semiconductor laser diode provides, in a method step A, an above-described semiconductor layer sequence with semiconductor layers applied vertically over one another with an active layer, which emits laser radiation via a radiation output surface during operation, wherein the radiation output surface is formed by a side face of the semiconductor layer sequence.

In accordance with a further embodiment, the method for producing the semiconductor laser diode provides for, in a method step B, large-area application of a thermal barrier layer on a main surface of the semiconductor layer sequence, wherein the thermal barrier layer is formed by an electrically insulating porous material. Large-area application of a layer on the main surface of the semiconductor layer sequence means that the layer is not applied in a structured manner in certain regions, but preferably in an unstructured manner over the whole main surface in a covering manner.

Furthermore, the method for producing the semiconductor laser diode can have a method step C, in which a region of the main surface of the semiconductor layer sequence is exposed by removal of the thermal barrier layer in certain regions.

In a further method step D, a contact layer can be applied on the exposed region of the main surface such that the contact layer and the thermal barrier layer are arranged laterally adjacent to one another on the main surface.

The features and embodiments described above and in the following apply equally to the semiconductor laser diode and the method for producing the semiconductor laser diode.

In particular, the contact layer and the barrier layer can be arranged directly and immediately adjacent to one another on the main surface. In other words, this means that side faces of the barrier layer and of the contact layer, i.e. faces which in each case delimit at least regions of the thermal barrier layer and the contact layer in a direction perpendicular to the vertical direction directly and immediately adjoin one another. In particular, an opening can be produced in the thermal barrier layer in the method step of exposing a region of the main surface of the semiconductor layer sequence by removal of the thermal barrier layer in certain regions, which opening determines the form of the contact layer and into which opening the material of the contact layer is then introduced.

In accordance with a further embodiment, the contact layer has a strip-shaped embodiment on the main surface of the semiconductor layer sequence and it adjoins the thermal barrier layer on at least two side faces. In a top view of the semiconductor laser diode in the vertical direction or in a suitable sectional view through the semiconductor laser diode along the main plane of extent of the layers of the semiconductor laser diode in particular, the contact layer can be embodied as a longitudinal strip, which subdivides the thermal barrier layer into two regions which are arranged on both sides of the strip in the transverse direction.

In particular, the strip-shaped metallic contact layer can reach from the radiation output surface to the rear side face of the semiconductor layer sequence lying opposite the radiation output surface. Therefore, in particular, the semiconductor laser diode can be embodied as a so-called stripe laser, for example as a so-called wide stripe laser. The shape and the width of the metallic contact layer which enables electrical contact to the semiconductor layer sequence and, in particular, to the active layer from one side of the semiconductor layer sequence determines the size and shape of an active region in the active layer, by means of which laser radiation can be emitted by the radiation output surface during operation.

In accordance with a further embodiment, the semiconductor laser diode has more than one metallic contact layer. In particular, the plurality of metallic contact layers can be embodied as longitudinal strips which are arranged next to one another in the transverse direction, alternating with regions of the thermal barrier layer.

In accordance with a further embodiment, the electrically insulating porous material of the thermal barrier layer comprises an oxide and/or nitride which has a multiplicity of pores. Particularly preferably, the electrically insulating porous material can comprise one or more of the following materials or consist thereof: $SiO_2$, $Al_2O_3$, $TiO_2$, $Ta_2O_5$, $HfO_2$, $ZrO_2$, AlN.

In accordance with a further embodiment, a sol-gel method is used for the large-area application of the thermal barrier layer on the main surface of the semiconductor layer sequence. To this end, a precursor material, for example a precursor sol or a precursor gel, is applied over a large area on the main surface of the semiconductor layer sequence. By way of example, the precursor material can be applied by spin coating. By way of supercritical drying, i.e. drying at an increased pressure and/or an increased temperature, the precursor material can be converted into an aerogel forming the electrically insulating porous material of the thermal barrier layer. By way of example, a sol made of a precursor and a solvent can be prepared in the sol-gel method. By way of example, the solvent can be water. In the case of a critical thermal budget of the substrate and/or the semiconductor layer sequence, interchanging the solvent with liquid $CO_2$ is possible in order to enable supercritical drying at low temperatures. By way of example, if an $SiO_2$ aerogel is intended to be produced as thermal barrier layer, it is possible to use tetramethyl orthosilicate (TMOS) as a precursor. A precursor gel can be formed by hydrolysis. By way of example, the precursor gel can be applied over a large area to the main surface of the semiconductor layer sequence by means of spin coating. Subsequently, the precursor gel can be dried in a supercritical manner, for example at a temperature of approximately 250° C. and a pressure of greater than or equal to 50 bar and less than or equal to 80 bar.

In accordance with a further embodiment for large-area application of the thermal barrier layer on the main surface, use is made of a method in which a layer with a plurality of particles is applied onto the main surface over a large area. By way of example, the layer with the plurality of particles can be formed by a monolayer of the particles applied over a large area. As an alternative thereto, it is also possible for the layer with the plurality of particles to be formed by a multi-layer with the particles. By way of example, the particles can be spherical. As an alternative thereto, other geometric forms of the particles are also possible. By way of example, the particles can be formed by polystyrene spheres. The layer with the particles forms a so-called template layer which has interstices between the particles. In a further method step, the interstices between the particles are filled with an electrically insulating material, in particular with one of the aforementioned oxides and/or nitrides. Particularly preferably, the interstices can be filled by means of an atomic layer deposition method. Subsequently, the particles in the electrically insulating material can be removed to form pores. By way of example, the particles can be removed by ashing, for example by means of an oxygen plasma. The steps of applying the layer with the plurality of particles, filling of interstices between the particles with an electrically insulating material and removing the particles to form pores in the electrically insulating material can also be carried out a number of times in succession in order to adjust a desired thickness of the thermal barrier layer. A defined number of cavities are created in the electrically insulating material by removing the particles such that the thermal conductivity of the thermal barrier layer can be adjusted in a targeted manner by way of this method. As an alternative to an atomic layer deposition method, it is also possible to use other coating methods such as, e.g., chemical vapor deposition. The particles can be applied onto the main surface of the semiconductor layer sequence by means of e.g. dip coating, spin coating or the Langmuir Blodgett method, known to a person skilled in the art.

In accordance with a further embodiment, the thermal barrier layer has a porosity of greater than or equal to 70%, greater than or equal to 74%, greater than or equal to 80% or even greater than or equal to 90%. In particular, a porosity of greater than or equal to 74% was found to be advantageous in the case where the thermal barrier layer is produced by means of the aforementioned particle-based method. In the case of a thermal barrier layer produced by means of a sol-gel method, for example in the case of a silica gel, a porosity of greater than or equal to 90% was found to be advantageous.

In accordance with a further embodiment, the thermal barrier layer has a thermal conductivity of greater than or equal to 0.02 W/(m·K). Furthermore, the thermal conductivity being less than or equal to 0.05 W/(m·K) may be sufficient. In particular, the product of thermal conductivity and thickness of the thermal barrier layer can result in the desired thermal resistance of the thermal barrier layer.

In accordance with a further embodiment, a dielectric capping layer is arranged on a side of the thermal barrier layer facing away from the semiconductor layer sequence. In particular, the capping layer can be free from pores. In particular, the capping layer can be applied immediately and directly onto the thermal barrier layer. In other words, the capping layer can be applied onto the thermal barrier layer over a large area prior to the method step of exposing a region of the main surface of the semiconductor layer sequence by removing the thermal barrier layer in certain regions being carried out. If the thermal barrier layer is removed in certain regions for exposing a region of the main surface, the capping layer can be removed in certain regions in the same method step, i.e. together with the thermal barrier layer.

By way of example, the capping layer can be applied by means of plasma-assisted chemical vapor deposition and it serves to seal the thermal barrier layer with a dielectric material. By way of example, the capping layer can comprise an oxide and/or nitride, for example one or more of the materials mentioned above in the context of the electrically insulating material of the thermal barrier layer. In this case, the capping layer and the thermal barrier layer can comprise different materials or else be of the same material. The capping layer can differ from the thermal barrier layer in the completed semiconductor laser diode in that the capping layer does not have pores while pores are contained in the thermal barrier layer.

In accordance with a further embodiment, a lithographic method is used in the method step of exposing a region of the main surface of the semiconductor layer sequence by removal of the thermal barrier layer in certain regions, and optionally also of the capping layer. To this end, the region to be removed can be defined by e.g. a photoresist. The structuring of the thermal barrier layer and, optionally, of the capping layer can be preferably carried out with a dry chemical method. As an alternative thereto, it can also be possible to use a wet chemical method, provided the latter can be controlled in an appropriate manner in relation to the etching effect, in particular on the porous thermal barrier layer.

In accordance with a further embodiment, an etching stop layer is applied to the semiconductor surface of the semiconductor layer sequence prior to the large-area application of the thermal barrier layer. In particular, the etching stop layer can serve to protect the main surface of the semiconductor layer sequence, i.e., in particular, the uppermost semiconductor layer of the semiconductor layer sequence, from the etching medium, i.e., for example, an etching plasma in the case of a dry chemical etching method. If an etching stop layer is present on the main surface, said etching stop layer, during the removal of the thermal barrier layer in certain regions, can be removed from the main surface in the same region in order thus to expose the main surface of the semiconductor layer sequence in the desired region. Therefore, the etching stop layer is still present between the thermal barrier layer and the semiconductor layer sequence in the completed semiconductor laser diode. In the case of a thermal barrier layer made of $SiO_2$, the etching stop layer can comprise e.g. $Al_2O_3$ or be formed therefrom.

In accordance with a further embodiment, the material of the metallic contact layers can be deposited over a large area of the thermal barrier layer and the exposed region of the main surface after the lithographic structuring of the thermal barrier layer. To this end, it is particularly advantageous if the photoresist, which was applied to define the region of the main surface to be exposed, additionally is arranged on the thermal barrier layer and, optionally, on the capping layer such that the contact layer can be structured in a simple manner by a lift-off technique and the contact layer is present on the main surface in the exposed regions. By way of example, the metallic contact layer can be applied by physical vapor deposition or sputtering.

In accordance with a further embodiment, the metallic contact layer comprises one or more metals, for example in the form of metal layers. By way of example, the contact layer can have one or more layers with gold and/or copper, as a result of which a desired current conductivity and thermal conductivity can be achieved. Furthermore, the metallic contact layer can comprise one or more of the materials selected from the following: platinum, titanium, titanium nitride, tantalum nitride, chromium, tungsten and tungsten nitride. Such materials can be advantageous, in particular as adhesion layers and/or diffusion barriers.

In accordance with a further embodiment, a metallization layer is applied onto the contact layer, after the application of the latter, and onto the thermal barrier layer. In particular, the metallization layer can be applied over a large area and form a solder metallization, by means of which the semiconductor laser diode can be assembled on a heatsink. By way of example, the metallization layer can also comprise one or more of the materials specified in the context of the metallic contact layer.

In accordance with at least one further embodiment, a semiconductor laser diode arrangement comprises a semiconductor laser diode, as described above, which is produced in accordance with the method described above, wherein the semiconductor laser diode is mounted on a heatsink in such a way that the thermal barrier layer is arranged between the semiconductor layer sequence and the heatsink. In other words, the main surface of the semiconductor layer sequence, on which the thermal barrier layer and the contact layer are applied, faces the heatsink. By way of example, the heatsink of the semiconductor laser diode arrangement can be formed by a suitable housing or a cooling body for the semiconductor laser diode.

A suitable lateral structuring of the heat dissipation from the semiconductor laser diode can be achieved during operation by means of the thermal barrier layer made of an electrically insulating porous material described here in order to homogenize the temperature profile in the semiconductor laser diode and thereby smooth said temperature profile in comparison with semiconductor laser diodes from the prior art. The thermal barrier layer can enable a very low thermal conductivity with, at the same time, a very high mechanical stability on account of the porous structure thereof. The materials described here for the thermal barrier layer, i.e. the aforementioned oxides and nitrides, and the production methods described here are advantageously compatible with semiconductor processing. In particular, what can be achieved by the thermal barrier layer, which is arranged laterally adjacent to the electrical contact layer, is that the heat generated during the operation of the semiconductor laser diode is predominantly dissipated from the semiconductor laser diode through the contact layer. While commercial semiconductor laser diodes have a large-area metallization in order to realize a low thermal resistance and thereby increase the efficiency of the laser diodes, an increased thermal resistance is accepted in the semiconductor laser diode described here in a targeted manner since an increase in the brilliance can be achieved by the targeted influencing of the temperature distribution in the semiconductor laser diode.

Further advantages, advantageous embodiments and developments emerge from the exemplary embodiments described below in conjunction with the figures.

In detail.

In the figures and exemplary embodiments, equal and equivalent elements and elements with the same effect can be provided with the same reference signs in each case. The depicted elements and their proportions in relation to one another should not be considered to be true to scale; rather, individual elements, such as e.g. layers, parts, components and regions, can be depicted with exaggerated dimensions for improved presentability and/or for improved understanding. FIGS. 1A to 1E show a method for producing a semiconductor laser diode 100 in accordance with one exemplary embodiment.

Figure 1A:
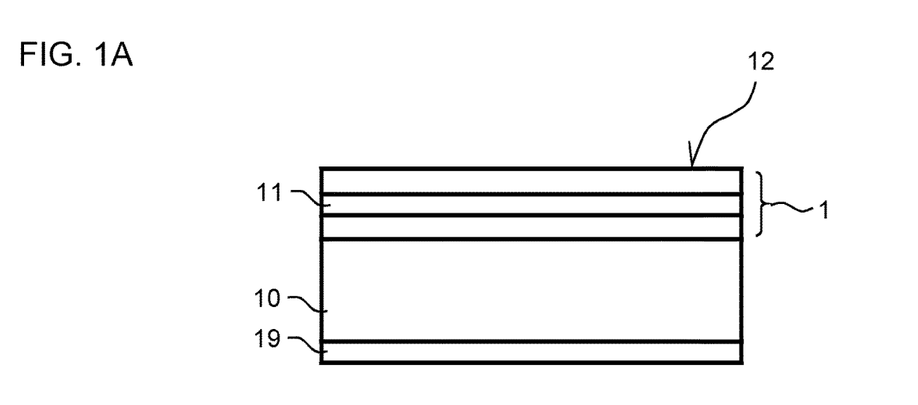
FIGS. 1A to 1E show a schematic illustration of a method for producing a semiconductor laser diode in accordance with one exemplary embodiment.

To this end, as shown in FIG. 1A, a semiconductor layer sequence 1 with semiconductor layers applied vertically above one another is provided in a first method step. In particular, the semiconductor layer sequence 1 has an active layer 11 which is configured to emit laser radiation over a radiation output surface during operation of the completed semiconductor laser diode 100. The completed semiconductor laser diode 100, as is depicted in FIG. 1E, has an emission direction perpendicular to the plane of the drawing such that the radiation output surface and the rear side face opposite the radiation output surface, which form a resonator, lie parallel to the plane of the drawing, upstream and downstream thereof. The semiconductor layer sequence 1 and, in particular, the completed semiconductor laser diode 100, is an edge-emitting semiconductor laser diode. By way of example, the semiconductor laser diode can be a high-power laser diode for fiber coupling, such as e.g. a bar laser or a wide-stripe laser. The basic design of such semiconductor laser diodes in view of the semiconductor layer is known to a person skilled in the art and it is therefore not explained in any more detail here.

In particular, the material of the semiconductor layer sequence 1 can be selected from a group III-V compound semiconductor material system, in particular an arsenide, phosphide and/or nitride compound semiconductor material system. In the shown exemplary embodiment, the semiconductor layer sequence 1 is applied to a substrate 10 which, for example, can be a growth substrate for the semiconductor layer sequence 1. As an alternative thereto, the substrate 10 can also be a carrier substrate, onto which the semiconductor layer sequence 1 was transferred after growing from the growth substrate. In particular, the substrate 10 depicted in the exemplary embodiment shown here is electrically conductive and a contact layer 19, by means of which the semiconductor layer sequence 1 and, in particular, the active layer 11 can be contacted from the substrate side, is arranged on the side of the substrate 10 opposite the semiconductor layer sequence 1. As an alternative to the shown exemplary embodiment, the provided semiconductor layer sequence 1 can be electrically contacted from the lower side, i.e. from the side of the substrate, also by way of other options known in the prior art.

On the side facing away from the substrate, the semiconductor layer sequence 1 has a main surface 12 which terminates the semiconductor layer sequence 1. Like in the shown exemplary embodiment, the main surface 12 can have a planar embodiment. As an alternative thereto, it can also be the case that semiconductor layers above the active layer 11 or, even additionally, a part of the active layer 11 as well are structured in a web-shaped manner such that the main surface 12 has a web structure.

The semiconductor layer sequence 1 shown in FIG. 1 can be, in particular, a semiconductor material in the wafer assemblage. In other words, the substrate 10 can be a substrate wafer, on which the semiconductor layer sequence 1 is applied. Individual semiconductor laser diodes can be separated from the semiconductor layer sequence 1 by way of singulation during a later method stage. As an alternative thereto, it is also possible for the semiconductor layer sequence 1 already to be singulated and provided for producing a single semiconductor laser diode. The latter case is shown in the following figures, purely for reasons of presentability.

In a further method step, a thermal barrier layer 2 is deposited over a large area onto the main surface 12, said thermal barrier layer being formed by an electrically insulating porous material. In the shown exemplary embodiment, the electrically insulating porous material is formed by a so-called aerogel, which has an electrically insulating oxide and/or nitride, in which a multiplicity of pores are contained. The oxide and/or nitride of the thermal barrier layer 2 can be selected, in particular, from one or more of $SiO_2$, $Al_2O_3$, $TiO_2$, $Ta_2O_5$, AlN, $HfO_2$, $ZrO_2$.

Figure 1B:
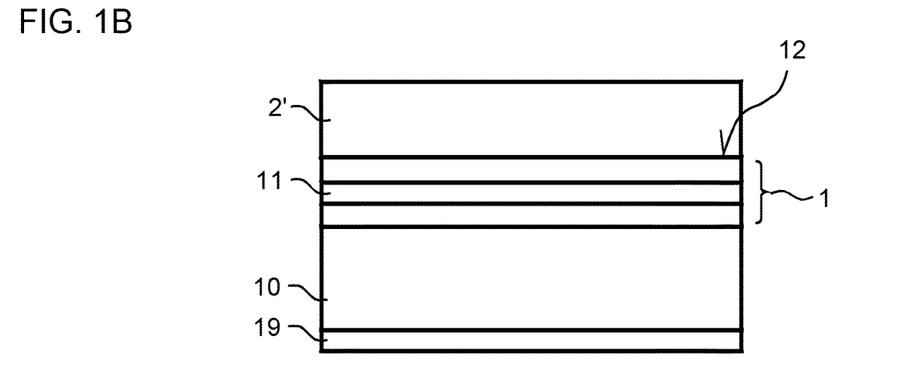
Figure 1C:
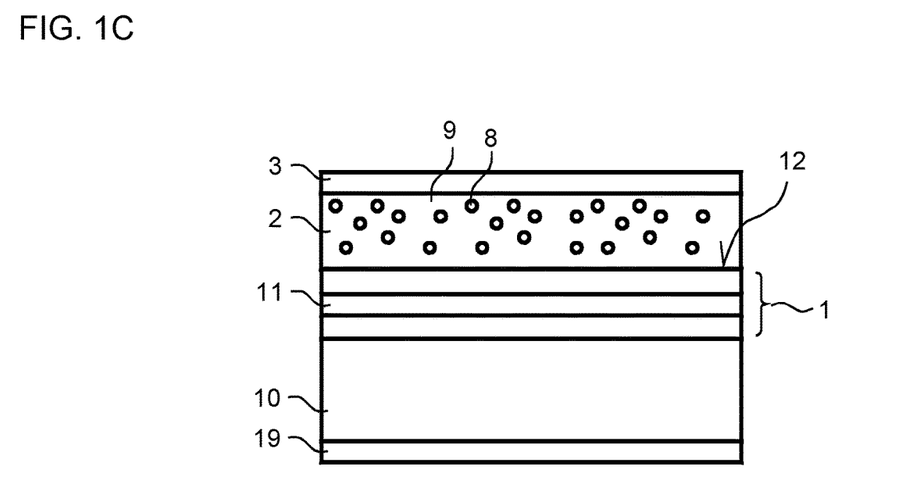

As shown in FIG. 1B, a precursor material 2' is applied over a large area onto the main surface 12 of the semiconductor layer sequence 1 for producing the thermal barrier layer 2 using a sol-gel method. Here, over a large area means that, preferably, the whole main surface 12 is covered by the precursor material 2' such that, when necessary, unevennesses of the main surface 12, such as e.g. already present web structures, can also be made planar. The precursor material 2' can be a precursor sol or a precursor gel. By way of example, if an aerogel on the basis of $SiO_2$ is produced as a thermal barrier layer 2, a sol made of a suitable precursor such as e.g. tetramethyl orthosilicate (TMOS) with water as a solvent can be prepared. This can be directly applied to the main surface 12 or, as an alternative thereto, a gel can be formed by hydrolysis and the precursor gel can subsequently be applied onto the main surface 2 as a precursor material 2'. The precursor material 2' is preferably applied by means of spin coating. Supercritical drying of the precursor material 2' can be achieved by way of supercritical drying, for example at a temperature of approximately 250° C. and a pressure of greater than or equal to 50 bar and less than or equal to 80 bar, as a result of which the thermal barrier layer 2, as is shown in FIG. 1C, is formed, which thermal barrier layer has an electrically insulating material 9, namely $SiO_2$ in the shown exemplary embodiment, with a multiplicity of pores 8. In the case of a high thermal sensitivity of e.g. the substrate 10 and/or the semiconductor layer sequence 1, the solvent can also be replaced by liquid $CO_2$ in order to enable drying at low temperatures.

By means of the sol-gel method it is possible to adjust the porosity of the thermal barrier layer 2 over a broad range. As a result of this, the thermal conductivity of the thermal barrier layer 2 can correspondingly be adjusted to be low in a targeted manner. As an alternative to $SiO_2$, the thermal barrier layer 2 can also have an aerogel based on e.g. $Al_2O_3$, $ZrO_2$ and/or $TiO_2$. In this case, the porosity can also be adjusted by way of the process parameters of the sol-gel method such that, in principle, it is possible to produce a defined desired thermal conductivity of the thermal barrier layer 2.

As is likewise shown in FIG. 1C, a capping layer 3 made of a dielectric material can be applied onto the thermal barrier layer 2, preferably over a large area, in a further method step. In particular, the capping layer 3 can be applied by means of plasma-assisted vapor deposition. The capping layer 3, which can have the same or a different oxide or nitride as the thermal barrier layer 2, serves to seal the thermal barrier layer 2.

Figure 1D:
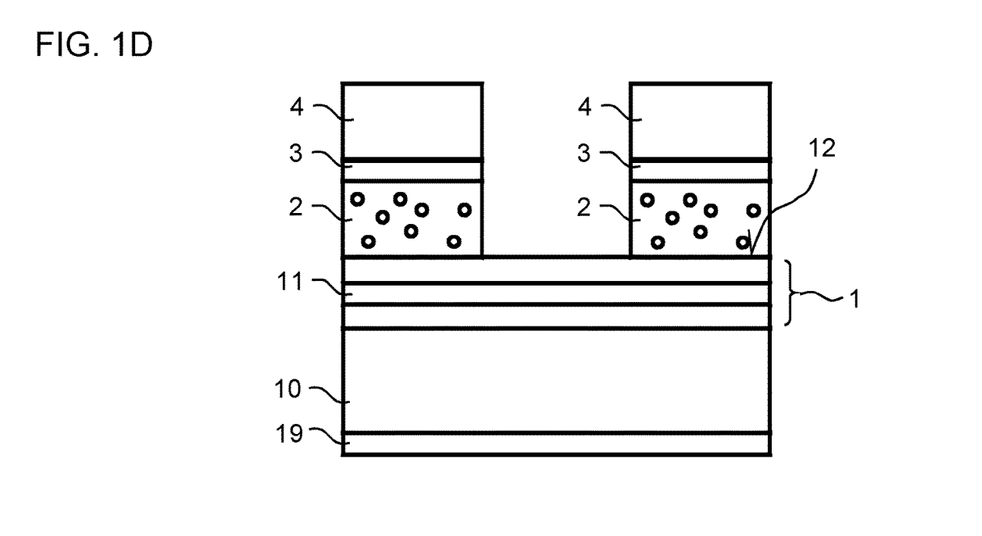
Figure 1E:
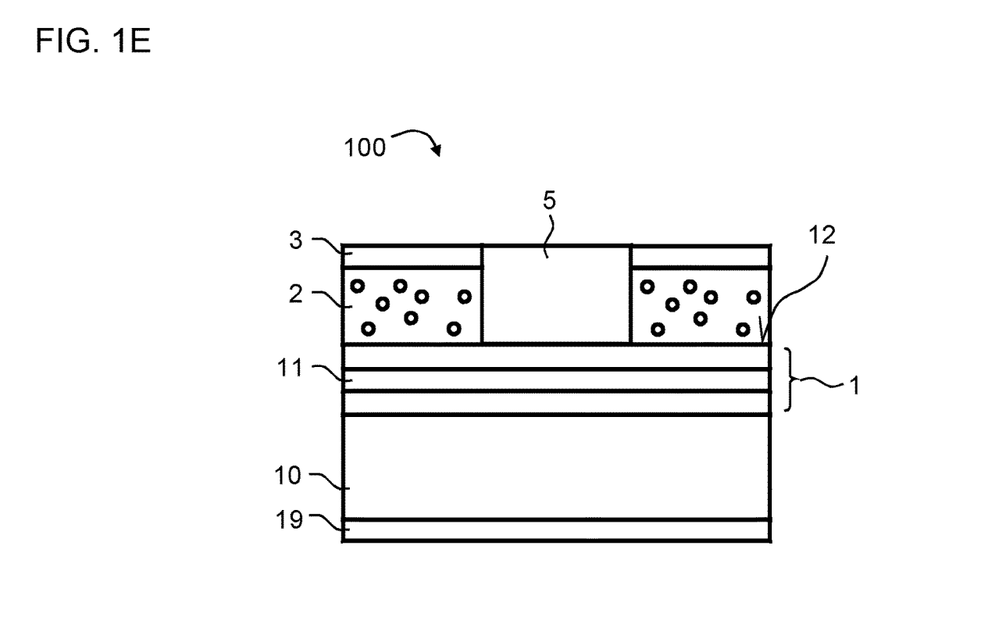

In a further method step, there is a lithography method for defining a contact face with respect to the semiconductor layer sequence 1 on the main surface 12, i.e. from the direction of the upper side. To this end, a photoresist 4 is applied with suitable structuring over the thermal barrier layer 2, as shown in FIG. 4. By way of subsequent dry chemical structuring of the capping layer 3 and the thermal barrier layer 2, it is possible to expose a region of the main surface 12 of the semiconductor layer sequence 1 by removing the thermal barrier layer 2 and the capping layer 3 in certain regions.

In a further method step, a suitable contact material for establishing a metallic contact layer 5 is deposited over the exposed main surface 12 and, at least in regions, over the photoresist 4. The contact material is deposited by e.g. physical vapor deposition or sputtering.

The contact material can be structured by means of a lift-off technique such that, as is shown in FIG. 1E, a contact layer 5 remains on the main surface 12 after lifting off the photoresist 4 in such a way that the thermal barrier layer 2 and the metallic contact layer 5 are arranged laterally adjacent to one another on the main surface 12 of the semiconductor layer sequence 1. In particular, the contact layer 5 can have a strip-shaped embodiment on the main surface 12 of the semiconductor layer sequence 1 in the case of the stripe laser-like embodiment of the semiconductor laser diode 100 described above and it can adjoin the thermal barrier layer 2 on at least two side faces. As shown in FIG. 1E, the electric contact layer 5 can have a planar embodiment with the capping layer 3 or, as an alternative thereto, it can also project thereover or it can be arranged in a recessed manner.

As described above, the semiconductor layer sequence 1 in a wafer assemblage can be provided with the above-described layers and, in particular, with a multiplicity of contact layers 5 such that individual semiconductor laser diodes 100 can be removed from the assemblage in a singulation step that follows now.

By way of the thermal barrier layer 2 which, as a result of the porous structure thereof, has a low thermal conductivity adjusted in a targeted manner, it is possible to avoid or at least reduce the thermal lensing effect, which is known from the prior art and restricts the brilliance of known high-power laser diodes. At the same time, the thermal barrier layer 2 has sufficient mechanical stability to avoid breakage of the semiconductor laser diode during the production process or during the assembly. In this case, it is possible to integrate the described process, in particular the sol-gel method, into the conventional chip production process such that it is possible, compared to the prior art, to produce mechanically stable semiconductor laser diodes with a higher brilliance, which may be advantageous for fiber coupling applications in particular.

Figure 2:
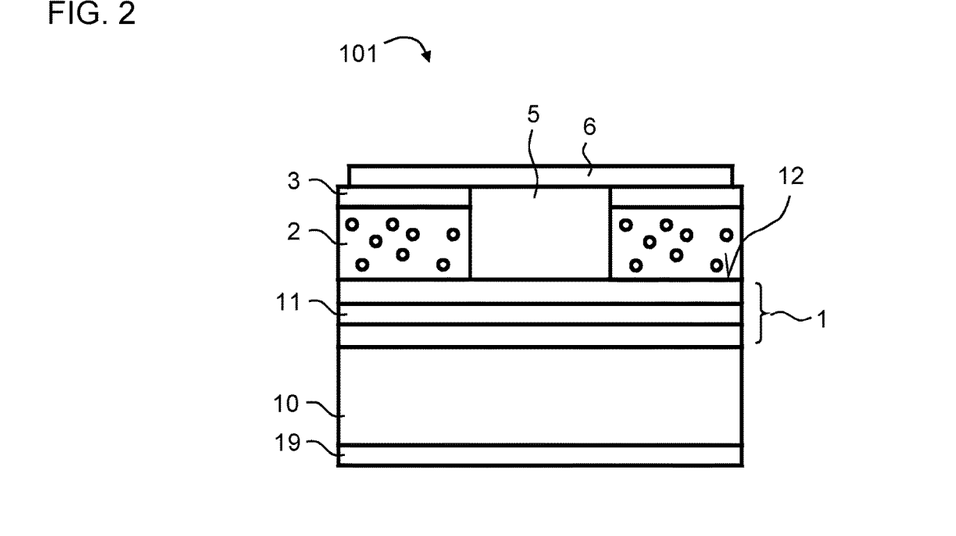
FIG. 2 shows a schematic illustration of a semiconductor laser diode in accordance with a further embodiment.

FIG. 2 shows a semiconductor laser diode 101 in accordance with a further exemplary embodiment which, compared to the semiconductor laser diode 100, has a metallization layer 6, which is deposited on the capping layer 3 and the contact layer 5. By way of example, the metallization layer 6 can be a solder metallization, by means of which the semiconductor laser diode 101 can be assembled on a heatsink.

Figure 3:
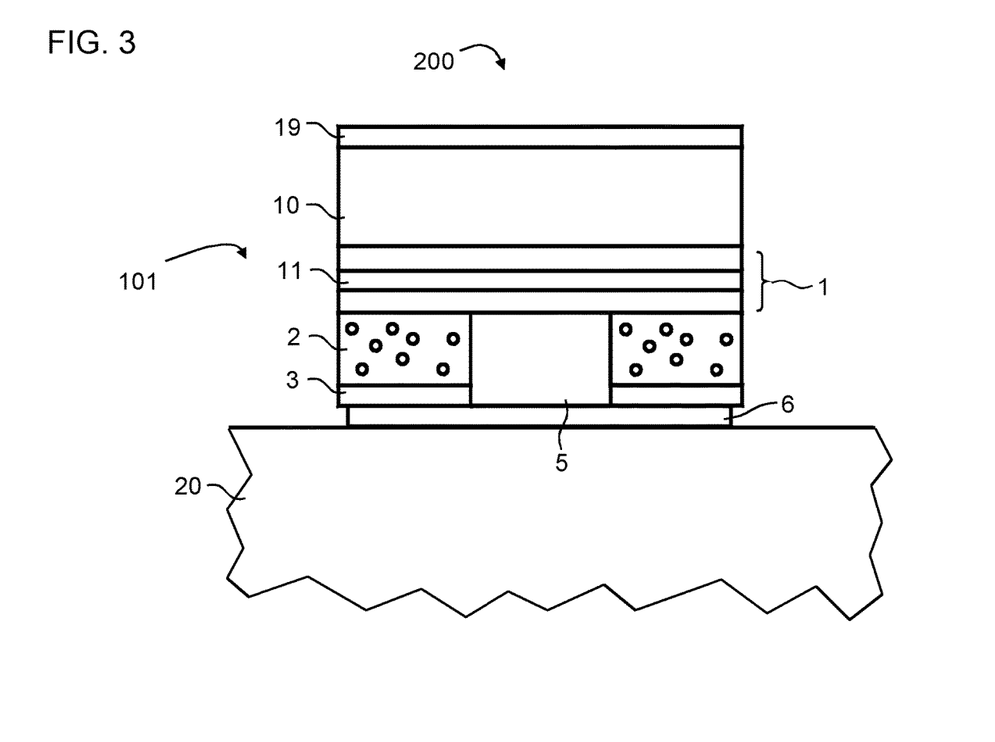
FIG. 3 shows a schematic illustration of a semiconductor laser diode arrangement in accordance with a further exemplary embodiment.

FIG. 3 shows a corresponding semiconductor laser diode arrangement 200, in which the semiconductor laser diode 101 in accordance with the exemplary embodiment of FIG. 2 is assembled on a heatsink 20 with the metallization layer 6. By way of example, the semiconductor laser diode 101 can be soldered onto the heatsink 20. By way of example, the heatsink 20 can be formed by a housing component or a cooling body. The semiconductor laser diode 101 is assembled on the heatsink 20 in such a way that the thermal barrier layer 2 is arranged between the semiconductor layer sequence 1 and the heatsink 20, and so the heat transport from the active layer 11 into the heatsink 20, and hence the temperature profile in the semiconductor layer sequence 1, can be influenced in a targeted manner by means of the thermal barrier layer 2.

FIGS. 4A to 4D show method steps of a method for producing a semiconductor laser diode 102 in accordance with a further exemplary embodiment, in which a protection layer is applied onto the main surface 12 of the semiconductor layer sequence 1 prior to depositing the thermal barrier layer 2 in order to protect the semiconductor layer sequence 1 and, in particular, the semiconductor layer forming the main surface 12. The latter usually can be formed by a p-doped semiconductor contact layer, which may be very sensitive to the etching plasma when structuring the thermal barrier layer 2.

Figure 4A:
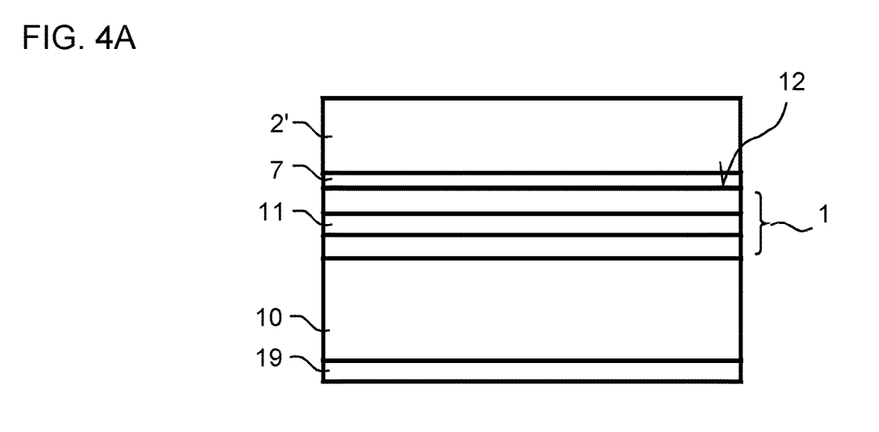
FIGS. 4A to 4D show schematic illustrations of method steps of a method for producing a semiconductor laser diode in accordance with a further exemplary embodiment and FIGS. 5A to 5D show schematic illustrations of method steps of a method for producing a semiconductor laser diode in accordance with a further exemplary embodiment.
Figure 4B:
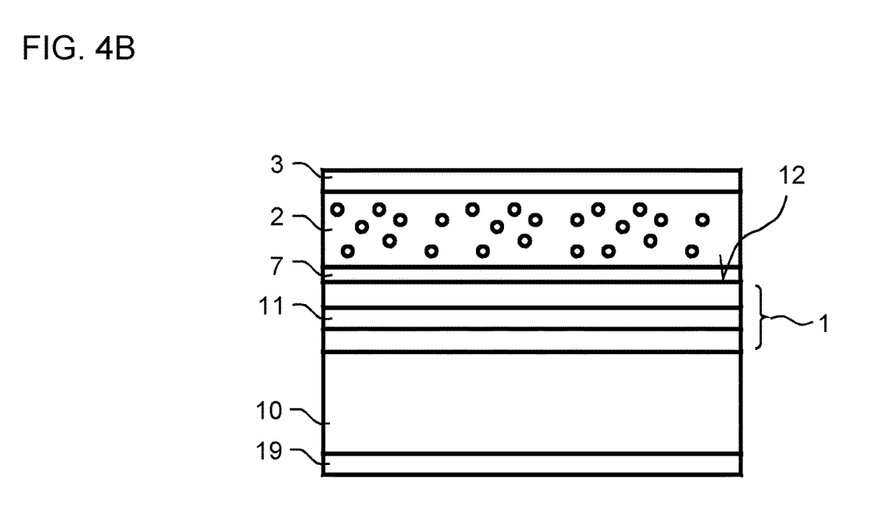
Figure 4C:
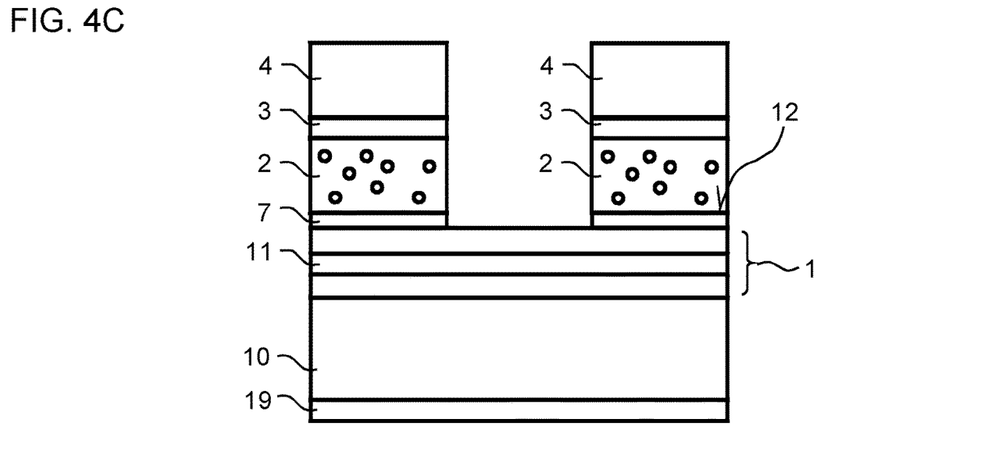

To this end, as shown in FIG. 4A, an etching stop layer 7 is applied onto the main surface 12, onto which etching stop layer the precursor material 2' is then applied in accordance with the above-described method step in conjunction with FIG. 1B. In the case of a thermal barrier layer based on an $SiO_2$ aerogel, the etching stop layer can comprise or consist of e.g. $Al_2O_3$. The method steps shown in FIGS. 4B to 4D correspond to the method steps described in conjunction with FIGS. 1C to 1E, namely the deposition of the capping layer 3 on the thermal barrier layer 2, the lithographic definition of the contact faces by a photoresist 4 and the structuring of the thermal barrier layer 2 and the capping layer 3, preferably by a dry chemical method, and the deposition of the metallic contact layer 5.

Figure 4D:
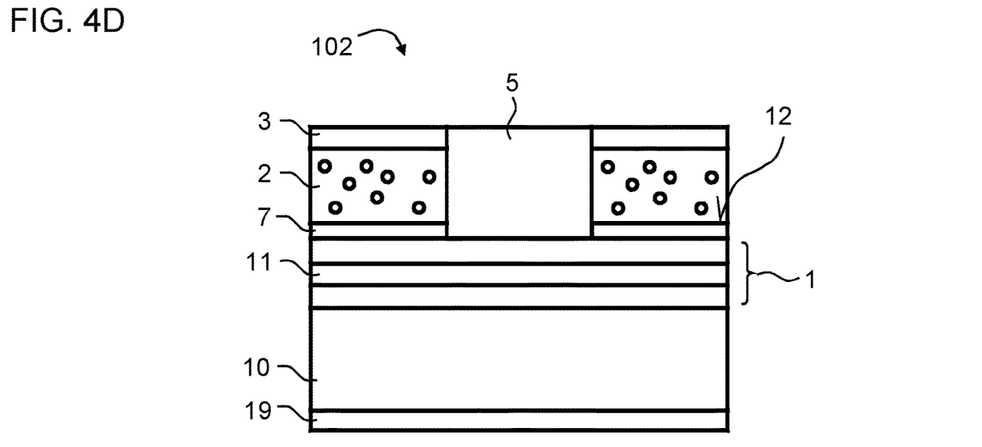

When removing the thermal barrier layer 2 in certain regions, the corresponding region of the etching stop layer 7 is also removed, and so the etching stop layer 7 is still present between the thermal barrier layer 2 and the semiconductor layer sequence 1, next to the contact layer 5, in the completed semiconductor laser diode 102.

A method for producing the thermal barrier layer 2 that is an alternative to the exemplary embodiment of FIGS. 1A to 1E is described in conjunction with FIGS. 5A to 5D.

Figure 5A:
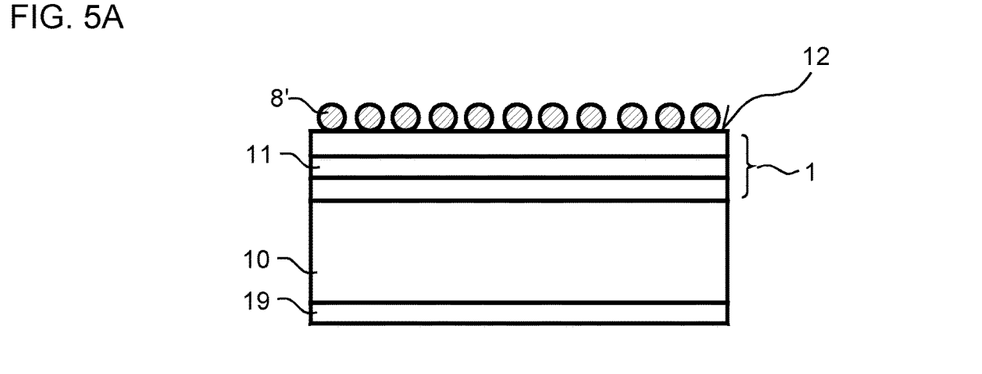

To this end, as shown in FIG. 5A, a layer with a plurality of particles 8' is applied onto the main surface 12 in the form of a so-called template layer. By way of example, the particles 8' can be applied in the form of a monolayer, as is shown in FIG. 5A, or in the form of a multi-layer. By way of example, the particles 8' can be spherical and preferably can be formed by polystyrene spheres. As an alternative thereto, other materials and geometries are also possible. The particles 8' are applied onto the main surface 12 of the semiconductor layer sequence 1 by way of e.g. dip coating, spin coating or the Langmuir Blodgett method.

Figure 5B:
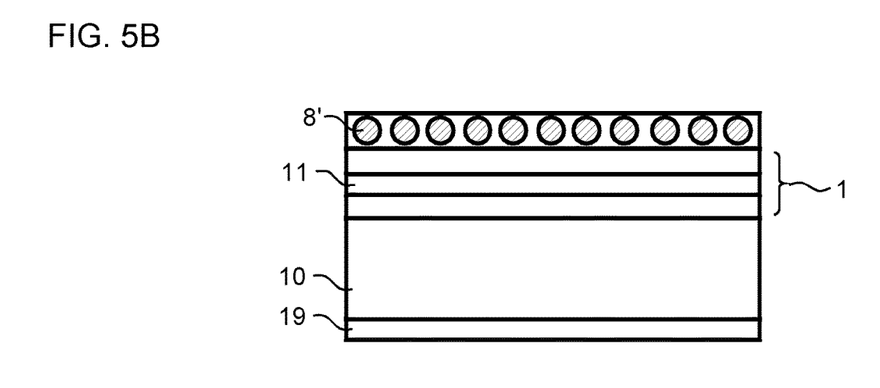
Figure 5C:
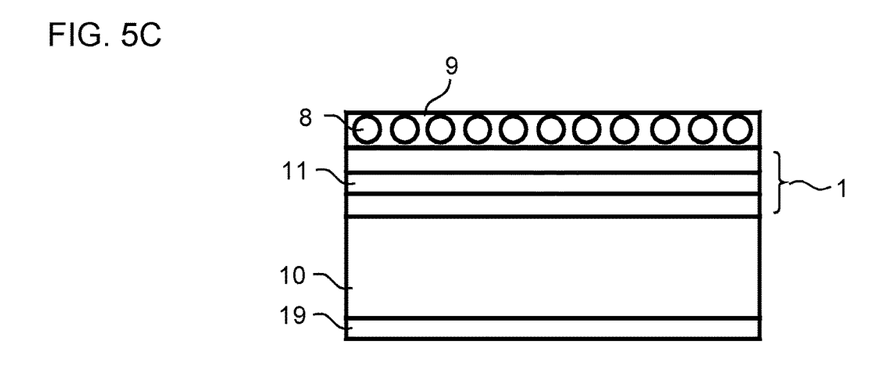

In a further method step, as shown in FIG. 5B, the interstices between the particles 8' are filled by way of a suitable coating method such as e.g. an atomic layer deposition method with a dielectric, i.e. electrically insulating material 9 such as e.g. $Al_2O_3$, $SiO_2$, $Ta_2O_5$, $ZrO_2$, $TiO_2$ or another material mentioned above.

Figure 5D:
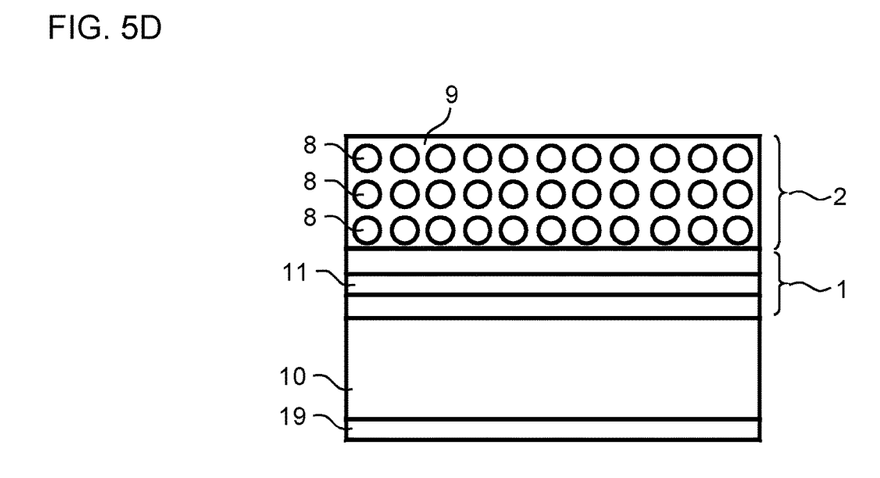

Subsequently, it is possible to remove the particles 8' by way of ashing using an $O_2$ plasma treatment, in particular in the case of polystyrene spheres, such that cavities in the form of pores 8 are created in the layer made of the electrically insulating material 9. By repeating the method steps shown in FIGS. 5A to 5C, it is possible to adjust the thickness of the thermal barrier layer 2 and the number of pores 8 in the electrically insulating material 9 in a targeted manner, as shown in FIG. 5D. Subsequently, the further layers described in conjunction with the method described above can be applied onto the thermal barrier layer 2 and it is possible to undertake corresponding structuring of the thermal barrier layer 2. The method of producing the thermal barrier layer 3 shown in conjunction with FIGS. 5A to 5D can be distinguished by great flexibility, e.g. in relation to the material selection of the electrically insulating material.

The features shown and described in the exemplary embodiments can also be combined with one another in accordance with further exemplary embodiments not explicitly shown here. Furthermore, the exemplary embodiments shown in the figures can have alternative or additional features in accordance with the general part of the description.

The invention is not restricted by the description on the basis of the exemplary embodiments. Rather, the invention comprises every novel feature and each combination of features, including in particular each combination of features in the patent claims, even if this feature or this combination itself is not explicitly specified in the patent claims or exemplary embodiments.

The invention claimed is:

1. A method for producing a semiconductor laser diode, comprising the following steps:
    A) provision of a semiconductor layer sequence with semiconductor layers applied vertically over one another with an active layer, which emits laser radiation via a radiation output surface during operation, wherein the radiation output surface is formed by a side face of the semiconductor layer sequence;
    B) large-area application of a thermal barrier layer on a main surface of the semiconductor layer sequence, wherein the thermal barrier layer is formed by an electrically insulating porous material;
    C) exposure of a region of the main surface of the semiconductor layer sequence by removal of the thermal barrier layer in certain regions; and
    D) application of a metallic contact layer on the exposed region of the main surface such that the contact layer and the thermal barrier layer are arranged laterally adjacent to one another on the main surface,
    wherein prior to method step C, a capping layer made of an electrically insulating material is applied to the thermal barrier layer over a large area and the capping layer is removed together with the thermal barrier layer in certain regions in step C,
    wherein a metallization layer is applied to the contact layer and the capping layer after method step D,
    wherein the capping layer is free from pores, and
    wherein the metallization layer is not broader than the thermal barrier layer.

2. The method according to claim 1, in which in method step B a precursor material is deposited in a sol-gel method and the precursor material is converted by supercritical drying into an aerogel forming the electrically insulating porous material.

3. The method according to claim 2, wherein the deposition of the precursor material is effected by spin coating.

4. The method according to claim 1, wherein method step B has the following sub-steps:
    B1) application of a layer with a plurality of particles;
    B2) filling of interstices between the particles with an electrically insulating material; and
    B3) removal of the particles to form pores in the electrically insulating material.

5. The method according to claim 4, in which method steps B1 to B3 are carried out several times in succession.

6. The method according to claim 4, in which the interstices are filled by means of atomic layer deposition in method step B2.

7. The method according to claim 4, in which the particles are formed by polystyrene spheres.

8. The method according to claim 4, in which the particles are removed by means of an oxygen plasma in method step B3.

9. The method according to claim 1, in which the capping layer is applied by means of plasma-assisted chemical vapor deposition.

10. The method according to claim 1, in which an etching stop layer is applied to the main surface of the semiconductor layer sequence prior to method step B.

11. The method according to claim 1, in which a dry chemical etching process is performed in method step C.

12. The method according to claim 1, wherein the contact layer has a strip-shaped embodiment on the main surface of the semiconductor layer sequence and adjoins the thermal barrier layer at at least two side faces, and
wherein method step C leads to a structuring of the thermal barrier layer.

13. A semiconductor laser diode, comprising:
a semiconductor layer sequence with semiconductor layers applied vertically over one another with an active layer, which emits laser radiation via a radiation output surface during operation, wherein the radiation output surface is formed by a side face of the semiconductor layer sequence; and
a thermal barrier layer and a metallic contact layer laterally adjacent to one another on a main surface of the semiconductor layer sequence,
wherein the thermal barrier layer is formed by an electrically insulating porous material,
wherein a dielectric capping layer is arranged on a side of the thermal barrier layer facing away from the semiconductor layer sequence,
wherein the capping layer is free from pores,
wherein a metallization layer is applied to the capping layer and the contact layer, and
wherein the metallization layer is not broader than the thermal barrier layer.

14. The semiconductor laser diode according to claim 13, wherein the contact layer has a strip-shaped embodiment on the main surface of the semiconductor layer sequence and adjoins the thermal barrier layer at at least two side faces.

15. The semiconductor laser diode according to claim 14, wherein the electrically insulating porous material comprises one or more of the following, selected from $Al_2O_3$, $TiO_2$, $Ta_2O_5$, $HfO_2$, $ZrO_2$, AlN.

16. The semiconductor laser diode according to claim 13, wherein the electrically insulating porous material comprises one or more of the following, selected from $SiO_2$, $Al_2O_3$, $TiO_2$, $Ta_2O_5$, $HfO_2$, $ZrO_2$, AlN.

17. A semiconductor laser diode arrangement comprising a semiconductor laser diode according to claim 13, wherein the semiconductor laser diode is mounted on a heatsink in such a way that the thermal barrier layer is arranged between the semiconductor layer sequence and the heatsink.

18. A semiconductor laser diode, comprising:
a semiconductor layer sequence with semiconductor layers applied vertically over one another with an active layer, which emits laser radiation via a radiation output surface during operation, wherein the radiation output surface is formed by a side face of the semiconductor layer sequence; and
a thermal barrier layer and a metallic contact layer laterally adjacent to one another on a main surface of the semiconductor layer sequence,
wherein the thermal barrier layer is formed by an electrically insulating porous material,
wherein a metallization layer is applied to the thermal barrier layer and the contact layer, and
wherein the metallization layer is a solder metallization.

19. The semiconductor laser diode according to claim 18, wherein a dielectric capping layer is arranged on a side of the thermal barrier layer facing away from the semiconductor layer sequence.

20. The semiconductor laser diode according to claim 19, wherein the capping layer is free from pores.

21. The semiconductor laser diode according to claim 19, wherein a metallization layer is applied to the capping layer and the contact layer.

22. A semiconductor laser diode, comprising:
a semiconductor layer sequence with semiconductor layers applied vertically over one another with an active layer, which emits laser radiation via a radiation output surface during operation, wherein the radiation output surface is formed by a side face of the semiconductor layer sequence; and
a thermal barrier layer and a metallic contact layer laterally adjacent to one another on a main surface of the semiconductor layer sequence, wherein the thermal barrier layer is formed by an electrically insulating porous material, and wherein a solder metallization is applied to the thermal barrier layer and the contact layer.

23. A method for producing a semiconductor laser diode, comprising the following steps:
A) provision of a semiconductor layer sequence with semiconductor layers applied vertically over one another with an active layer, which emits laser radiation via a radiation output surface during operation, wherein the radiation output surface is formed by a side face of the semiconductor layer sequence;
B) large-area application of a thermal barrier layer on a main surface of the semiconductor layer sequence, wherein the thermal barrier layer is formed by an electrically insulating porous material;
C) exposure of a region of the main surface of the semiconductor layer sequence by removal of the thermal barrier layer in certain regions;
D) application of a metallic contact layer on the exposed region of the main surface such that the contact layer and the thermal barrier layer are arranged laterally adjacent to one another on the main surface,
wherein a metallization layer is applied to the thermal barrier layer and the contact layer, and
wherein the metallization layer is a solder metallization.

* * * * *